(12) United States Patent
Takamatsu et al.

(10) Patent No.: US 6,744,490 B2
(45) Date of Patent: Jun. 1, 2004

(54) DEVICE FOR PROCESSING OF A STRIP-SHAPED WORKPIECE

(75) Inventors: Hirosuke Takamatsu, Yokohama (JP); Yoshihiko Mitsumoto, Sagamihara (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,846

(22) Filed: May 31, 2002

(65) Prior Publication Data

US 2002/0191164 A1 Dec. 19, 2002

(30) Foreign Application Priority Data

Jun. 1, 2001 (JP) ........................................ 2001-166993

(51) Int. Cl.⁷ ............................................. G03B 27/52
(52) U.S. Cl. ........................................... 355/40; 355/41
(58) Field of Search ............................. 355/27, 40, 41, 355/50, 75; 271/3.16; 242/410–423.2

(56) References Cited

U.S. PATENT DOCUMENTS

| | | | | |
|---|---|---|---|---|
| 2,147,421 A | * | 2/1939 | Bendz | 226/42 |
| 2,295,327 A | * | 9/1942 | Bendz | 226/40 |
| 2,907,565 A | * | 10/1959 | Sauter | 226/42 |
| 3,177,749 A | * | 4/1965 | Best et al. | 83/208 |
| 3,203,635 A | * | 8/1965 | Rayfield et al. | 242/331.4 |
| 3,236,429 A | * | 2/1966 | Klein | 226/42 |
| 3,240,411 A | * | 3/1966 | Zarleng | 226/42 |
| 3,471,103 A | * | 10/1969 | Gabor | 242/331.4 |
| 3,773,275 A | * | 11/1973 | Coppa et al. | 242/331.4 |
| 4,814,793 A | | 3/1989 | Hamada et al. | |
| 4,996,541 A | | 2/1991 | Mori et al. | |
| 5,501,412 A | * | 3/1996 | McAleavey | 242/417.1 |
| 5,713,533 A | * | 2/1998 | Nordlof et al. | 242/418.1 |
| 6,243,160 B1 | | 6/2001 | Takano | |

FOREIGN PATENT DOCUMENTS

| | | |
|---|---|---|
| JP | 63-267937 | 11/1988 |
| JP | 02-100036 | 4/1990 |

* cited by examiner

*Primary Examiner*—Rodney Fuller
(74) *Attorney, Agent, or Firm*—Nixon Peabody LLP; David S. Safran

(57) ABSTRACT

Transport of strip-shaped workpieces, including those that have through openings, is control based on the output of upper and lower sensors provided between the delivery reel and processing part for detecting sagging of the workpiece at two points. The strip-shaped workpiece is subjected to processing and transport with a preset frequency, and upon occurrence of a state in which the upper sensor has determined the absence of sagging of the workpiece on the delivery side of the processing part and the lower sensor of this side has determined the presence of the workpiece, a fault is recognized, and processing and transport are interrupted if this detected state does not change during an interval that is a multiple of the preset frequency.

2 Claims, 9 Drawing Sheets upper sensor: transmission
lower sensor: transmission upper sensor: shielding
lower sensor: transmission upper sensor: transmission
lower sensor: transmission

DEVICE FOR PROCESSING OF A STRIP-SHAPED WORKPIECE

BACKGROUND OF THE INVENTION

1. Field of the Invention

The invention relates to a device for processing of a strip-shaped workpiece, which device transports and processes a strip-shaped workpiece. The invention relates especially to a device for processing of a strip-shaped workpiece in which the operation of a delivery reel and/or a take-up reel can be carried out without problems even in the case in which the strip-shaped workpiece has through openings when a mask pattern is exposed onto the strip-shaped workpiece.

2. Description of the Related Art

In a device which transports and processes a strip-shaped workpiece (hereinafter also called a "workpiece") generally a method is used in which a strip-shaped workpiece is pulled off a delivery reel which supplies it, positioned in a processing part of the device at the desired position, and is wound onto a take-up reel. Hereinafter, a continuous workpiece with a great length, such as a rolled film of organic compound, foil metal or the like, is called a "strip-shaped workpiece".

In one such processing device, there are cases in which, between the delivery reel and the processing part, and between the processing part and the take-up reel, there is a dip of the workpiece in which part of the strip-shaped workpiece sags, i.e., the length of the workpiece between the delivery reel and first guide roller is longer than the distance between them so that the workpiece sags between them. The reason for producing this sag is to keep the tension which is exerted on the strip-shaped workpiece constant, and to adjust for the changes in diameter of the workpiece being unwound off of the delivery reel and wound onto the take-up reel, and to transport the workpiece in the processing part with high stop positioning accuracy. In this way, the transport of the strip-shaped workpiece and operation of the delivery reel and the take-up reel can be carried out independently of one another.

The strip-shaped workpiece is transported by a transport roller located downstream of the processing part in terms of transport together with a pressure roller clamping and turning the workpiece. The delivery reel and the take-up reel are operated such that the length of the strip-shaped workpiece is determined in the dips by sensors and based on these determination signals the rotation and stopping of the reels are controlled. Japanese patent disclosure document HEI 2-100036 describes a device for exposing a strip-shaped workpiece which is provided with the above described dips.

FIG. 6 shows the arrangement of a transport system for a strip-shaped workpiece which is provided with the above described dips. In the figure, a delivery reel 1 is wound with a strip-shaped workpiece W. The strip-shaped workpiece W is delivered by the delivery reel 1 which is driven by a drive device 25, sent via a first dip A and the guide roller 3 to a processing part 10 and subjected to processing.

Transporting of the strip-shaped workpiece W is carried out by a pressure roller 5 and a transport roller 6 which are each located upstream and downstream of the transport direction of a carrier 15 of the processing part 10. The strip-shaped workpiece W is sent by a drive control of the transport roller 6 onto the carrier 15 of the exposure part 10 which is downstream in the transport direction at a set position.

In the processing part 10, there are, for example, a lamp 11 which emits light which contains UV light, a reflector 12, a condenser lens 13, a mask M with a mask pattern, a projection lens 14 and the like. The light which contains UV light and which is emitted by the lamp 11 is reflected by the reflector 12 and is emitted via the condenser lens 13, the mask M and the projection lens 14 onto the strip-shaped workpiece on the carrier 15. Thus the mask pattern of the mask M is exposed on the strip-shaped workpiece W. The above described processing part is hereinafter also called the "exposure part". After completion of exposure, the strip-shaped workpiece W is wound via a guide roller 4 and a second dip B onto a take-up reel 2 which is driven by a drive device 26.

Determination of the strip-shaped workpiece Win dips A and B and operation on the delivery side and the take-up side as shown in FIG. 6 are shown and is described briefly below.

The strip-shaped workpiece W is determined using pairs of sensors of the transmission type 21, 22; 23, 24 which are located one above the other, i.e. at two vertically spaced points of each of the dips A and B.

In the above described sensors of the transmission type 21, 22; 23, 24, the emission elements 21a, 22a, 23a, 24a belong to one group and the light receiving elements 21b, 22b, 23b, and 24b belong to one group. When the sensor light emitted by the emission elements 21a, 22a, 23a, 24a is shielded by the strip-shaped workpiece Wand is not received by the light receiving elements 21b, 22b, 23b, 24b, it is determined that the strip-shaped workpiece W is located between the two elements. Hereinafter, the sensors 21, 23 are called the "upper sensors" and the sensors 22, 24 are called the "lower" sensors. Furthermore, the state in which the light receiving elements 21b, 22b, 23b, 24b of sensors 21, 22, 23 and 24 are not shielded by the strip-shaped workpiece W is called "transmission" and the state in which they are shielded by the strip-shaped workpiece W is called "shielding".

(1) Control of the delivery reel

Using FIGS. 7(a) to 7(f), control of a conventional delivery reel is described. FIGS. 7(a) to 7(f) show part on the delivery or takeoff side shown in FIG. 6. The strip-shaped workpiece W is transported by the transport roller 6 shown in FIG. 6 in the direction toward the exposure part 10 which is located on the right side in the figure.

(a) As is shown in FIG. 7(a), the delivery reel 1 turns and begins to deliver the strip-shaped workpiece W and the amount of sagging of the strip-shaped workpiece W is small so that both the upper sensor 21 and also the lower sensor 22 of the dip A are in the transmission state. In this state, the strip-shaped workpiece W is allowed to sag in the dip A.

(b) The delivery reel 1 turns and the strip-shaped workpiece W shields the upper sensor 21, as shown in FIG. 7(b), the delivery reel 1 continues to turn.

(c) As is shown in FIG. 7(c), the strip-shaped workpiece W shields the upper sensor 21 and the lower sensor 22. When this state occurs, the delivery reel 1 stops rotation and delivery of the strip-shaped workpiece W.

(d) As is shown in FIG. 7(d), the strip-shaped workpiece W continues to be transported so that the lower sensor 22 is shifted into the transmission state, while the upper sensor 21 is still located in the shielding state. The delivery reel 1 continues the state in which its rotation is stopped.

(e) As is shown in FIG. 7(e), as the strip-shaped workpiece W continues to be transported, both the upper sensor 21 and also the lower sensor 22 are shifted into the transmission state (in the same state as the state described above in 7(a)), the delivery reel 1 again turns and delivery of the strip-shaped workpiece W begins again.

(f) The state which is shown in FIG. 7(f), in which transmission takes place to the upper sensor 21 but the lower sensor 22 is shielded is one that cannot properly occur when the strip-shaped workpiece W is being transported normally. Occurrence of this state is presumably produced because the lower sensor 22 is shielded by scrap and foreign bodies (hereinafter called "barrier"). The rotation of the delivery reel 1 and the transport and processing of the strip-shaped workpiece W are therefore stopped and a fault indication is output.

The above described control is summarized below using Table 1.

TABLE 1

| Upper Sensor 21 | Transmission | Shielding | Shielding | Transmission |
|---|---|---|---|---|
| Lower Sensor 22 | Transmission | Transmission | Shielding | Shielding |
| Delivery Reel control | Rotation | Continuation of operation | Stopping | Fault |

(2) Control of the Take-Up Reel

Using FIGS. 8(a) to 8(f), control of a conventional take-up reel is described. FIGS. 8(a) to 8(f) show part of the take-up side shown in FIG. 6. The strip-shaped workpiece W is transported from the exposure part 10 to the right by the transport roller 6; in FIG. 6, the exposure part is located on the left side of the take-up side.

(a) As is shown in FIG. 8(a), the upper sensor 23 and the lower sensor 24 are located in the dip B in the transmission state and the take-up reel 2 is stopped. The strip-shaped workpiece W is transported after completion of exposure by the exposure part 10 and delivered to the dip B.

(b) When the strip-shaped workpiece is being delivered, the strip-shaped workpiece W shields the upper sensor 23, as is shown in FIG. 8(b). The take-up reel 1 remains stopped.

(c) As is shown in FIG. 8(c), the strip-shaped workpiece W shields the upper sensor 23 and the lower sensor 24. The take-up reel 2 begins to turn and take up the strip-shaped workpiece W.

(d) As is shown in FIG. 8(d), the strip-shaped workpiece W is taken up and the lower sensor 24 is shifted into the transmission state. The upper sensor 23 is in the shielding state. The take-up reel 2 continues to turn.

(e) As is shown in FIG. 8(e), the strip-shaped workpiece W continues to be taken up. When both the upper sensor 23 and also the lower sensor 24 are shifted into the transmission state (in the same state as the state described above in (a)), the take-up reel 22 stops turning.

(f) Here, it can be imagined that the state which is shown in FIG. 8(f) and in which transmission to the upper sensor 23 takes place and the lower sensor 24 is shielded is caused by shielding of the lower sensor 24 by a barrier. It is assumed that there cannot properly be this state, as described above relative to the delivery side. Rotation of the take-up reel 2 and transport and processing of the strip-shaped workpiece Ware therefore stopped and a fault indication is output.

The above described control is summarized below using Table 2.

TABLE 2

| Upper Sensor 23 | Transmission | Shielding | Shielding | Transmission |
|---|---|---|---|---|
| Lower Sensor 24 | Transmission | Transmission | Shielding | Shielding |
| Take-up Reel Control | Stopping | Continuation of Operation | Rotation | Fault |

Both on the above described delivery side and also on the above described take-up side, the operation of the reels is called "continuation of previous operation" when the upper sensor is in the shielding state and the lower sensor is in the transmission state. When the upper sensor is in the transmission state and the lower sensor is in the shielding state, operation of the reels is called "stopping of operation due to a problem."

As was described above, in the transport system shown in FIG. 6, the transport of the strip-shaped workpiece for processing by the transport roller 6, delivery of the delivery reel 1 and take-up of the take-up reel 2 are carried out independently of one another.

There are cases in which the strip-shaped workpiece W has through openings which are called "device holes." FIG. 9 shows one example of a strip-shaped workpiece W with device holes. As FIG. 9 shows, in the strip-shaped workpiece W there are device holes Wd and perforation holes Ph which are used, for example, for transport of the strip-shaped workpiece W. In the areas which are provided with device holes Wd, various devices are installed in a later process. Using these through openings, wiring is connected and devices are installed.

The device holes Wd are through openings and therefore pass sensor light. In the dips A and B which are shown in FIG. 6, there are therefore cases in which, depending on the length of the sag of the strip-shaped workpiece W and depending on the pitch with which the device holes Wd are provided, the sensor light passes through the through openings, and in which the existence of the strip-shaped workpiece W cannot be determined even if it is present.

There are, for example, the following cases:

The light from the upper sensors 21, 23 passes through the device holes Wd and a transmission state is determined; and The light from the lower sensors 22, 24 is shielded by the area outside the device holes Wd and a shielding state is determined.

In this case the above described conventional device indicates a fault and stops treatment even if transport could be carried out without problems.

The above described defect is eliminated when the sensors 21, 24 are positioned at locations which are not provided with device holes Wd, for example, at locations at which the peripheral area of the strip-shaped workpiece W is determined. The shape and the size of the device holes Wd are however different depending on the pattern formed in the strip-shaped workpiece W, such as a circuit pattern or the like, and there are very many patterns thereof.

Therefore, according to the pattern the positions of the sensors 21 to 24 must be changed in the dip, by which a working step is required each time. Furthermore, at the positions at which the sensors 21 to 24 are attached, artificial faults often creep in. Therefore, practical execution is difficult.

SUMMARY OF THE INVENTION

The invention was devised to eliminate the above described defects in the prior art.

The object of the invention is achieve in a device for processing a strip-shaped workpiece in which:

- a strip-shaped workpiece is provided with a dip, which has been formed by sagging of a strip-shaped workpiece, between the delivery reel and the processing part, and between the processing part and take-up reel;
- the length of the dips is determined;
- the strip-shaped workpiece is delivered by one reel and taken up by one reel; and
- a device is provided for driving the delivery reel;
- an upper sensor and a lower sensor are located on top of one another at two locations of the dips; and
- moreover, regardless of the above described delivery and the above described take-up, transport and processing of the strip-shaped workpiece are performed so as to enable the transport of the strip-shaped workpiece, its delivery by a reel and its take-up onto a reel to be continued even if the strip-shaped workpiece has partial through openings, such as device holes or the like, and even if sensor light passes through the above described through holes.
- by the following being done in accordance with the invention:

(1) generally, a control element carries out processing and transport of the strip-shaped workpiece with a preset frequency when the upper sensor has determined the absence of the workpiece, and the lower sensor has determined the presence of the workpiece, and which detects a fault and interrupts processing and transport when the workpiece determination state by the above described upper sensor and the above described lower sensor does not change during the interval during which the above described processing and the above described transport are carried out.

The delivery reel is controlled as follows by the above described control element.

(a) In the case of a strip-shaped workpiece with through openings, there is not always a barrier in the optical path of the lower sensor, as was described above, even if in the dip transmission of the upper sensor and shielding of the lower sensor were determined. In this case, the device is therefore not immediately considered "disrupted," but is considered "in a fault reservation state". The strip-shaped workpiece is processed and transported with a preset frequency, for example three times.

(b) When, during the above described interval, the determination state of the strip-shaped workpiece by the above described upper sensor and the above described lower sensor does not change, the device is considered "faulty" and operation of the device is stopped.

(c) If at any time during the above described interval the states of the upper sensor and of the lower sensor change, at this point the "fault reservation state" is canceled. Only afterwards, based on the determination signals of the sensors is operation of the delivery reel controlled. This means that the length and the position of the strip-shaped workpiece in the dip change during the intervals during which processing and transport are repeated several times, when the strip-shaped workpiece is correctly delivered. Here, the positions of the through openings and of the shielding area of the strip-shaped workpiece change, and a change arises with certainty in the determination state of the strip-shaped workpiece by the sensors.

When the determination state of the strip-shaped workpiece changes, it is recognized that the strip-shaped workpiece is being correctly delivered. Thus, the "fault reservation state" is canceled and operation of the delivery reel is controlled based on the determination signals of the sensors, as is normally the case.

On the other hand, it can be imagined that, in the vicinity of the sensor located downstream, there is a barrier which shields the sensor light, or that the lower sensor is faulty when in the determination state of the strip-shaped workpiece no change occurs even with several repetitions of processing and transport. In this case, the device is considered "faulty" and stopped.

A strip-shaped workpiece with through openings can be easily transported by the above described control.

(2) Additionally, in device described above in (1) for processing of a strip-shaped workpiece there is, generally, a control element which starts operation of the take-up reel when both the upper sensor and the lower sensor have determined the presence of the workpiece and which stops operation of the take-up reel when the upper sensor has determined the absence of a workpiece.

The take-up reel is controlled as follows specifically by the above described control element.

In the case in which transmission of the upper sensor and shielding of the lower sensor have been determined, in a strip-shaped workpiece with through openings there is not always a barrier in the optical path of the lower sensor, as was described above. In this case, the device is therefore not immediately considered "faulty". In this state, the rotation of the take-up reel is only started when the drive of the take-up reel has been stopped and when both the upper sensor and lower sensor have determined shielding. The rotation of the take-up reel is stopped when the upper sensor has determined transmission. In this case, the length and the position of the strip-shaped workpiece in the dip change when the strip-shaped workpiece is being transported. Thus, a case arises in which both the upper sensor and also the lower sensor determine shielding. When the sensors are shifted into this state, the take-up reel is turned and the strip-shaped workpiece is taken up.

As was described above, the transport of the strip-shaped workpiece, its delivery by a reel and its take-up onto a reel can be continued even if the strip-shaped workpiece has partial through openings, such as device holes or the like, through which sensor light passes by the measure as according to the invention that processing and transport of the strip-shaped workpiece are carried out with a preset frequency when the upper sensor has determined the absence of the workpiece and the lower sensor has determined the presence of the workpiece, these sensors being located in the transition on the side of the delivery reel, and furthermore that a fault is recognized and processing and transport are interrupted, when during the interval, during which the above described processing and the above described transport are carried out, the workpiece determination state by the above described upper sensor or the above described lower sensor does not change.

In the case in which the sensor located downstream of the dip on the side of the delivery reel due to a barrier or the like is shifted into a shielding state, or in the case in which in this sensor a fault or the like occurs, it is recognized that a fault has occurred and thus operation of the device can be stopped.

On the side of the take-up reel, the operation of the take-up reel is started only when both the upper sensor and lower sensor have determined the presence of a workpiece and furthermore, here, operation of the take-up reel is stopped when the upper sensor has determined the absence of the workpiece. In this way, the strip-shaped workpiece can be taken up without stopping operation of the device even in the case in which the sensor located downstream of the dip on the side of the take-up reel due to a barrier or the like is shifted into a shielding state, or that in this sensor a fault or the like occurs.

The invention is explained in detail below with reference to the accompanying drawings.

DETAILED DESCRIPTION OF THE INVENTION

Figure 1:
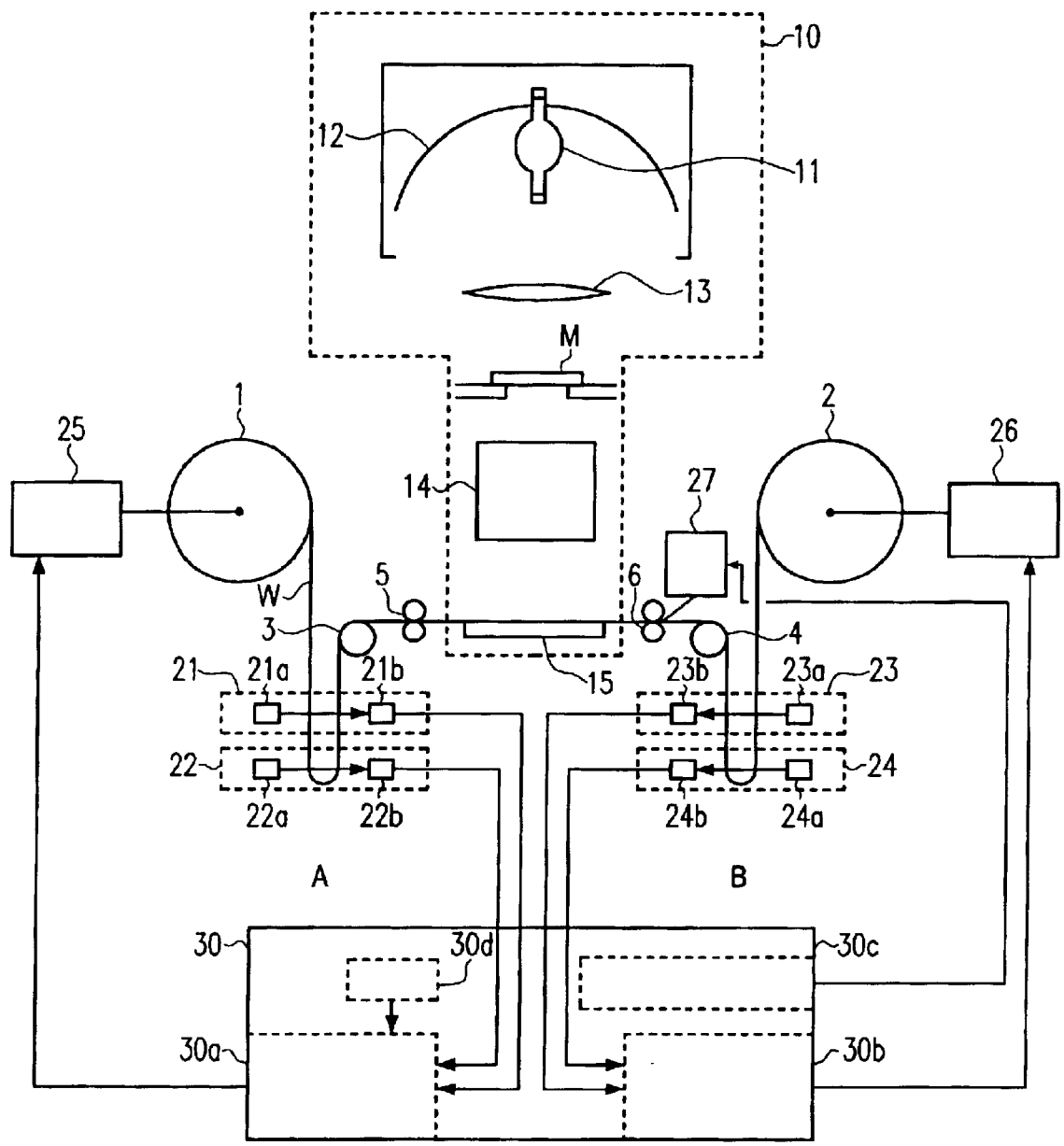
FIG. 1 shows a schematic of the arrangement of one embodiment of the device in accordance with the invention for processing a strip-shaped workpiece.

FIG. 1 shows a schematic of the arrangement of one embodiment of the device in accordance with the invention for processing a strip-shaped workpiece. A case is described below in which a mask pattern is projection-exposed onto the strip-shaped workpiece by projection exposure. However, the processing of the strip-shaped workpiece is not limited to the above described projection exposure, but other processing can be done.

In FIG. 1, as was described above, the strip-shaped workpiece W with which the delivery reel 1 is wound is delivered by the delivery reel 1, which is driven by the device 25, and is sent via a first dip A and the guide roller 3 to the exposure part 10 and undergoes exposure.

A control element 30 comprises a delivery reel control element 30a for drive control of the delivery reel 1, a take-up reel control element 30b for control of the take-up reel 2 and a transport roller control element 30c for control of the transport roller 6. The transport roller 6 is controlled in the same way as in the conventional case and is explained in detail, for example, in the above described Japanese patent disclosure document HEI 2-100036.

The delivery reel control element 30a of the control element 30 subjects the above described device 25 for driving the delivery reel to drive control based upon the outputs of the upper sensor 21 and the lower sensor 22, these sensors 21, 22 being provided in the dip A, and controls the amount of sag of the strip-shaped workpiece W in the dip A.

Transporting of the strip-shaped workpiece W is, as was described above, carried out by the pressure roller 5 and the transport roller 6 which are located upstream and downstream of the exposure element 10 relative to transport direction of the carrier 15 of the exposure part (processing part) 10. The transport roller control element 30c of the control element 30 by the device 27 for driving the transport roller subjects the transport roller to drive control, sends the strip-shaped workpiece W onto the carrier 15 of the exposure part 10 and positions it at a predetermined position.

The strip-shaped workpiece W which has been positioned on the carrier 15 is exposed in the exposure part 10. This means that the light which contains UV light and which is emitted by the lamp 11 is reflected by the reflector 12 and is emitted via the condenser lens 13, the mask M and the projection lens 14 onto the strip-shaped workpiece on the carrier 15. Thus, the mask pattern of the mask M is exposed on the strip-shaped workpiece W. After completion of exposure the strip-shaped workpiece W is taken up via a guide roller 4 and second dip B onto a take-up reel 2 which is driven by a device 26 for driving the take-up reel.

The take-up reel control element 30b of the control element 30 by the outputs of the upper sensor 23 and the lower sensor 24 subjects the above described device 26 for driving the take-up reel to drive control, these sensors 23 and 24 being provided in the dip B, and controls the amount of sag of the strip-shaped workpiece W in the dip B.

Figure 6:
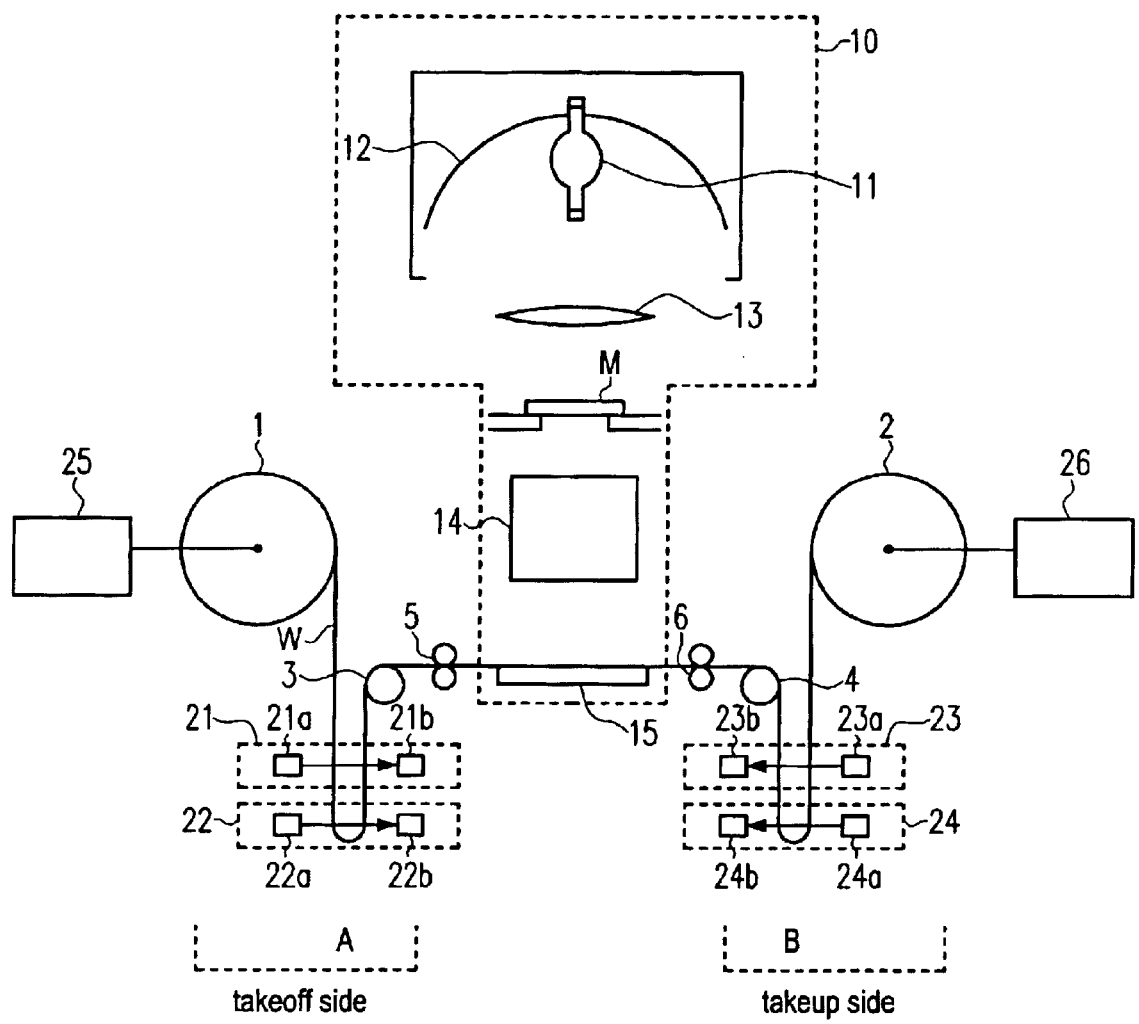
FIG. 6 shows a schematic of the arrangement of the transport system for a strip-shaped workpiece which has been provided with dip in accordance with the prior art.
Figure 7A:
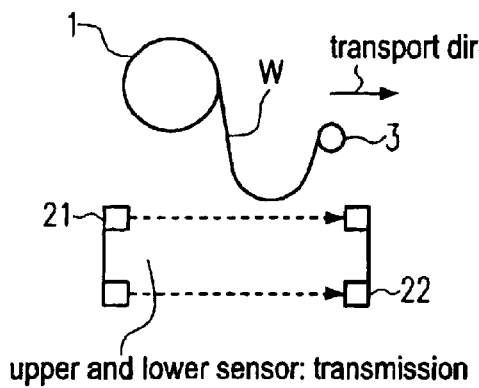
FIGS. 7(a) to 7(f) each show a schematic of the control of a conventional delivery reel.
Figure 7B:
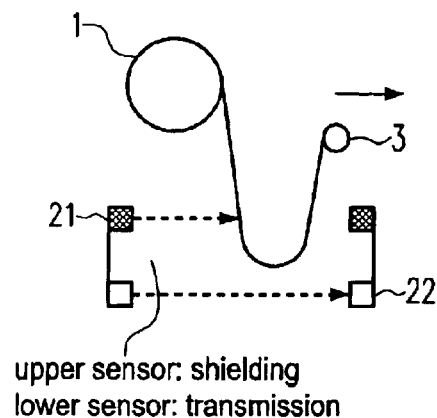
Figure 7C:
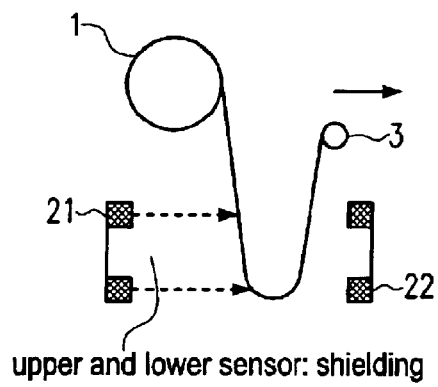
Figure 7D:
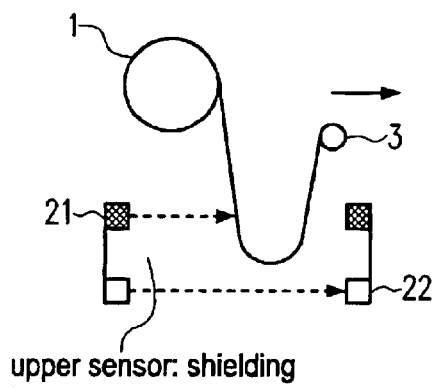
Figure 7E:
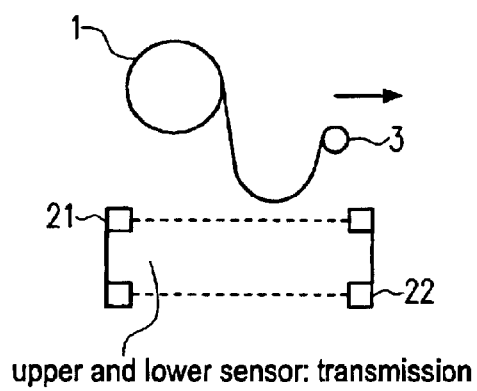
Figure 7F:
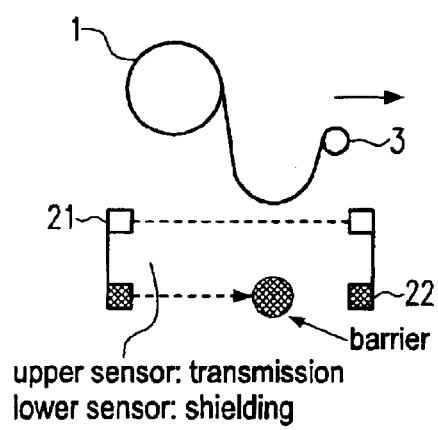
Figure 8A:
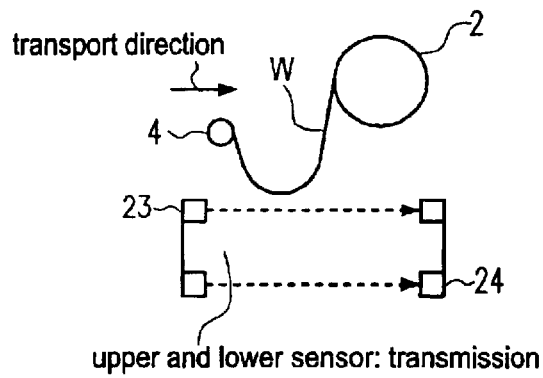
FIGS. 8(a) to (f) each show a schematic of the control of a conventional take-up reel.
Figure 8B:
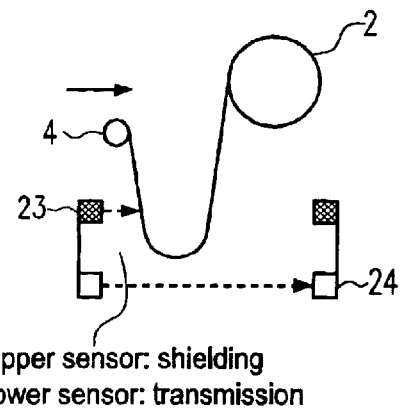
Figure 8C:
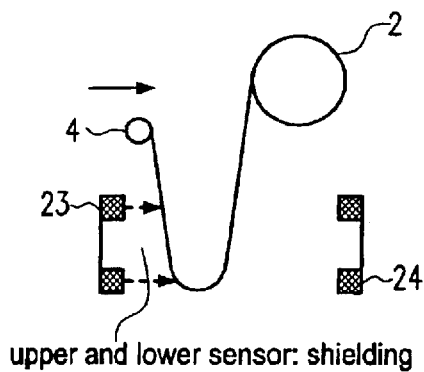
Figure 8D:
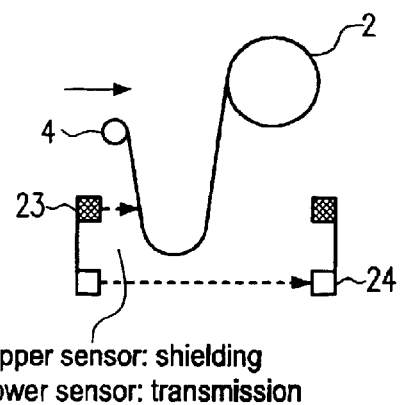
Figure 8E:
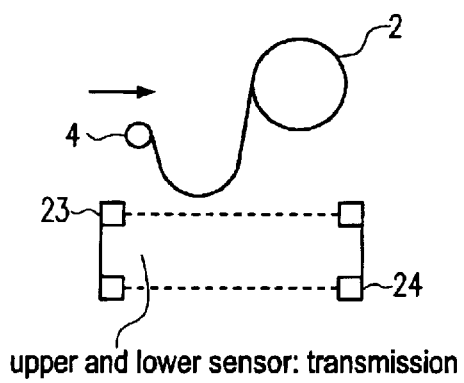
Figure 8F:
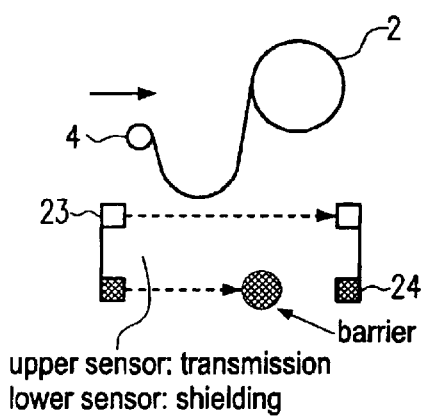

The strip-shaped workpiece W is determined in the dips A and B in the same manner as described above with FIG. 6 using sensors 21, 22, 23, 24 of the transmission type which are located in pairs, with one sensor above the other, i.e. at two points. In the above described sensors 21, 22, 23, 24 of the transmission type, the emission elements 21a, 22a, 23a, 24a belong to one group and light receiving elements 21b, 22b, 23b, and 24b belong to another group. The first group emits sensor light which is received by the respective element of the second group which is located opposite the respective element of the first group. Because the sensor light emitted by the emission elements 21a, 22a, 23a, 24a is shielded by the strip-shaped workpiece W, it is determined that the strip-shaped workpiece W is present.

Figure 9:
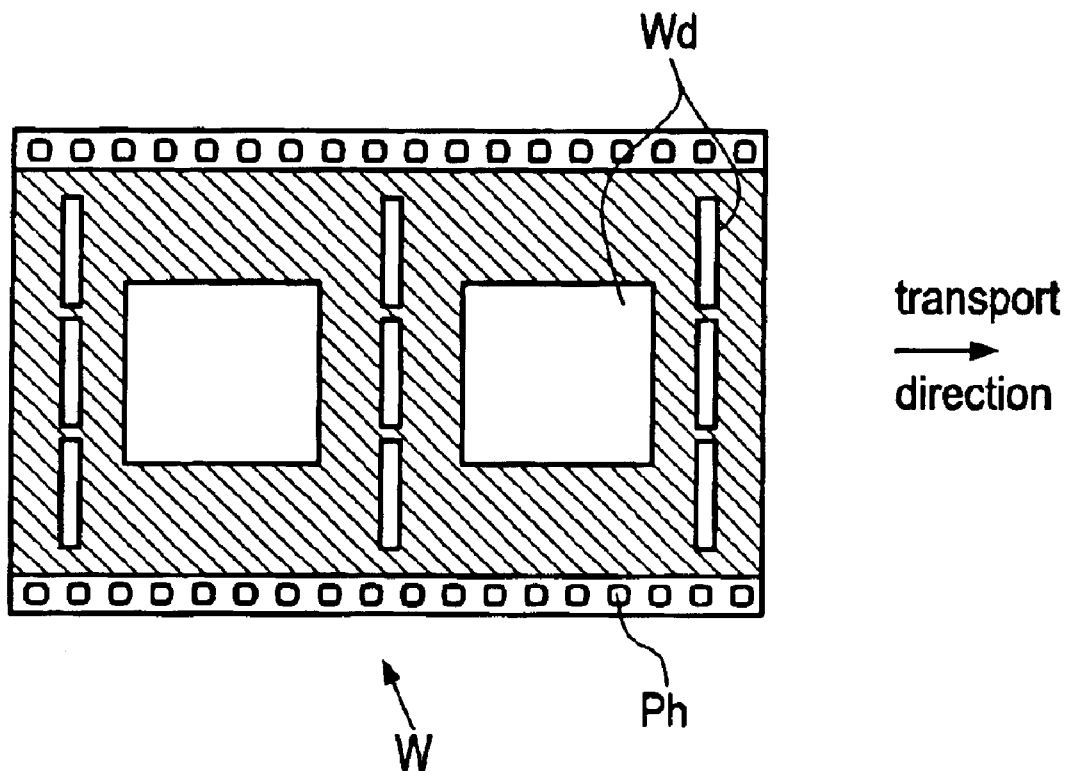
FIG. 9 shows a schematic of one example of a known strip-shaped workpiece with through openings which are called device holes.

In this embodiment, the strip-shaped workpiece W, as was shown using FIG. 9, is provided with device holes Wd as through openings. As was described above, there are cases where the sensor light passes through the above described through openings even in the case in which the strip-shaped workpiece W is located at a position at which it shields the upper sensor 21, or the upper sensor 21 and the lower sensor 22, and in which the upper sensor 21 or the lower sensor 22 are shifted into the transmission state.

In the above described device for processing of a strip-shaped workpiece, the control of the delivery reel 1 by the delivery reel control element 30a of the control element 30 and the control of the take-up reel 2 by the take-up reel control element 30b of the controllers are described below.

A. Control of the Delivery Reel

In this embodiment, the delivery reel control element 30a of the control element 30 controls the delivery reel 1 in the manner shown below using Table 3 based on the outputs of the upper sensor 21 and the lower sensor 22 of the dip A.

TABLE 3

| Upper Sensor 21 | Transmission | Shielding | Shielding | Transmission |
|---|---|---|---|---|
| Lower Sensor 22 | Transmission | Transmission | Shielding | Shielding |
| Delivery reel Control | Rotation | Continuation of Operation | Stopping | Fault reservation; continuation of operation |

This means that, in the case in which the amount of sag of the strip-shaped workpiece W in dip A is small and both the upper sensor 21 and also the lower sensor 22 are in the transmission state, the delivery reel 1 is turned. In this way, if the amount of sag of the strip-shaped workpiece W is increased and both the upper sensor 21 and also the lower sensor 22 are shifted into the shielding state, rotation of the delivery reel 1 is stopped. By stopping the delivery reel 1, the amount of sag of the strip-shaped workpiece W is reduced. When both the upper sensor 21 and also the lower sensor 22 are shifted again into the transmission state, the delivery reel 1 is turned. In this way, control is exercised such that the lower end of the strip-shaped workpiece W is in the dip A between the upper sensor 21 and the lower sensor 22. During the above described operation, the sensor light is passed, for example, by the device holes which are through holes provided in the strip-shaped workpiece W. There are the following cases.

(1) Transmission state of the upper sensor 21 and transmission state of the lower sensor 22
(2) Shielding state of the upper sensor 21 and transmission state of the lower sensor 22
(3) Transmission state of the upper sensor 21 and shielding state of the lower sensor 22

In the above described case (1), the delivery reel 1 is turned. In the above described case (2), the previous operating state is continued. If, for example, the delivery reel 1 turns, the rotary state is continued. When the delivery reel 1 stops, the stopped state is continued. The above described case (3) is called the "fault reservation state" in this example. The control element 30 recognizes a fault and stops the device only when this state has been continued by the upper sensor 21 and the lower sensor 22 during the interval with a frequency of transport and exposure (for example, three times) which was set beforehand in an adjustment part 30d of the control element 30.

The control of the delivery reel 1 by the above described delivery reel control element 30a is described below using FIGS. 2(a) to 2(c) and FIGS. 3(d) to 3(g). The transport direction or the like of the strip-shaped workpiece W is identical to the transport direction or the like described above using FIGS. 7(a) to 7(f).

Figure 2A:
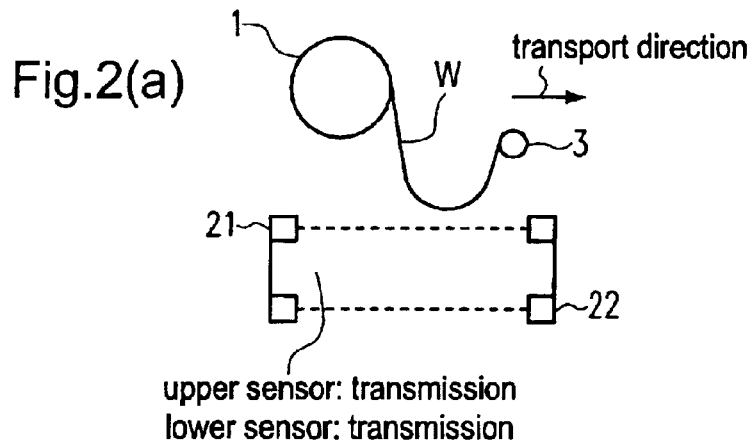
FIGS. 2(a) to 2(c) each show a schematic of a first control of a delivery reel.

(1) As is shown in FIG. 2(a), the delivery reel 1 is turned and the strip-shaped workpiece W is delivered when the amount of sag of the strip-shaped workpiece W is small and when both the upper sensor 21 and also the lower sensor 22 of the dip A are in the transmission state. In this way, the strip-shaped workpiece W begins to sag in dip A.

Figure 2B:
Figure 2B:
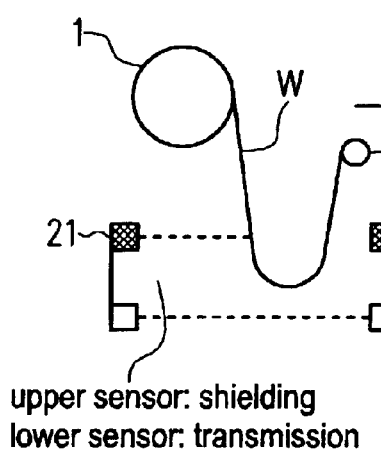

(2) When the delivery reel 1 turns, the tip of the dip of the strip-shaped workpiece W is between the upper sensor 21 and the lower sensor 22. Here, the sensors can be in the following two states;

(i) As is shown in FIG. 2(b), the shielding area of the strip-shaped workpiece W shields the upper sensor 21. This is the same state as in the conventional example shown in FIG. 7(b). In this case of the shielding state of the upper sensor 21 and the transmission state of the lower sensor 22, the previous state is continued; this relates to operation of the delivery reel 1. This means that rotation of the delivery reel 1 continues.

Figure 2C:
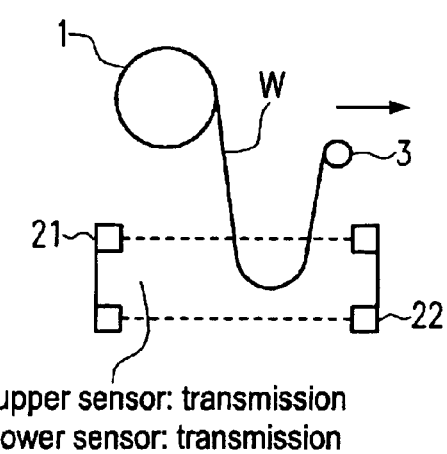

(ii) As is shown in FIG. 2(c), the sensor light of the upper sensor 21 passes through the through openings of the strip-shaped workpiece W. In this way, both the upper sensor 21 and also the lower sensor 22 are shifted into the transmission state. This is the same state as the state shown above using FIG. 2(a). As was described above using FIG. 2(b), the delivery reel 1 turns.

(3) By continuing the rotation of the delivery reel 1, delivery of the strip-shaped workpiece W to the dip A advances, by which the tip of the dip is located underneath the lower sensor 21. The upper sensor 21 and the lower sensor 22 can be in any of the following four states here.

Figures 3D, 3E:
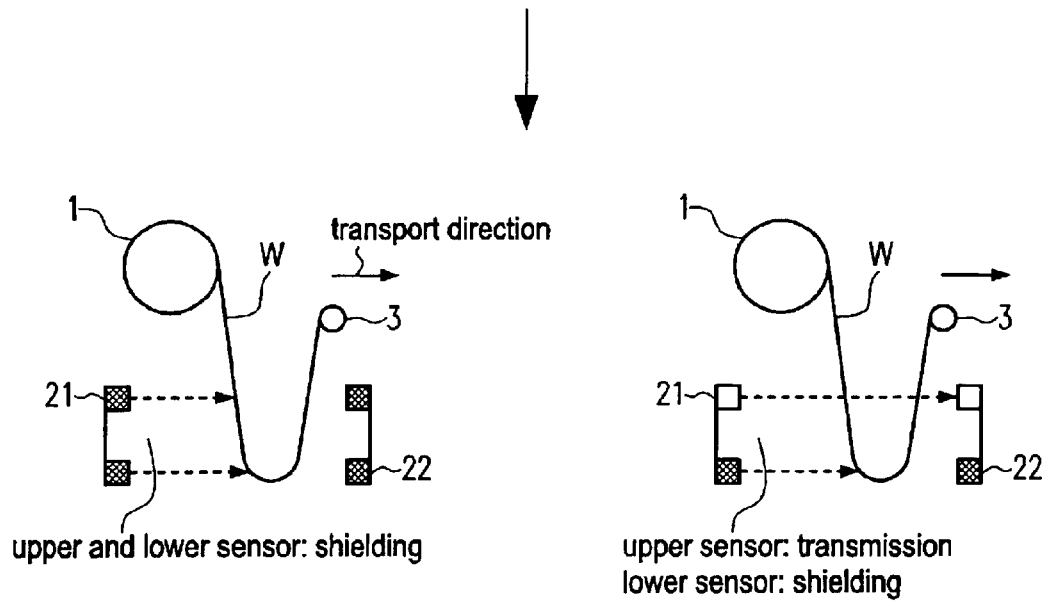
FIGS. 3(d) to 3(g) each show a schematic of a second control of a delivery reel.

(i) As is shown in FIG. 3(d), the shielding area of the strip-shaped workpiece W shields the upper sensor 21 and the lower sensor 22. In this case, the delivery reel 1 stops rotation and delivery of the strip-shaped workpiece W.

(ii) As is shown in FIG. 3(e), the sensor light of the upper sensor 21 passes through the through openings of the strip-shaped workpiece W. The upper sensor 21 is shifted into the transmission state and the lower sensor 22 is shifted into the shielding state.

Conventionally, this was considered "faulty". In this embodiment, the device is not immediately considered "faulty," but rather is put in "a fault reservation state." In this case of "transmission of the upper sensor 21" and "shielding of the lower sensor 22," the previous state is continued; this relates to operation of the delivery reel 1. In this state, the control element 30 continues operation of the device for processing of the strip-shaped workpiece. The control element 30 recognizes a fault and stops the device only when the state as shown in FIG. 3(e) is continuously maintained by the upper sensor 21 and the lower sensor 22 during an interval with a frequency of transport and processing (exposure), for example, during triple exposure and triple transport, which was set beforehand in an adjustment part 30d of the control element 30.

If, during this interval, the sensor states change from the states shown in FIG. 3(e), the control element 3 at this instant resets "fault reservation" and continues operation according to the sensor states at this instant.

Figures 3F, 3G:
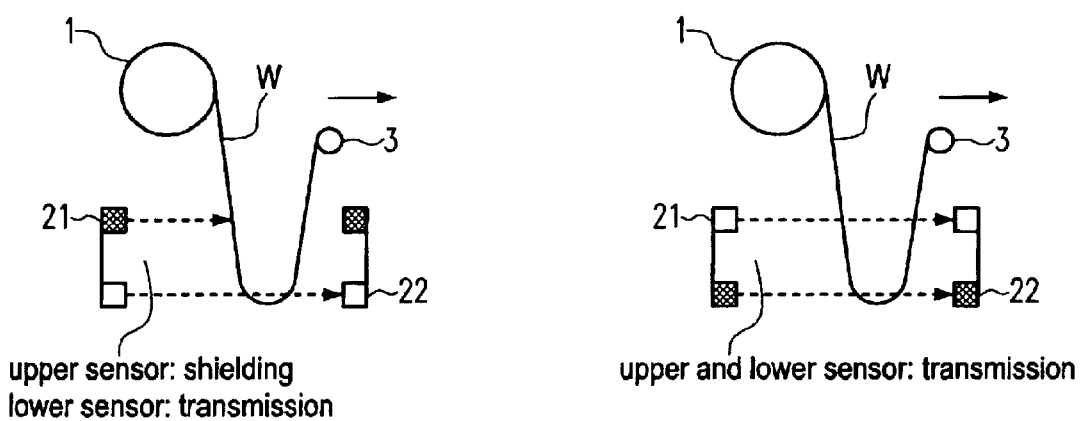

When, due to factors such as a barrier, a fault of the lower sensor 22 and the like, the upper sensor 21 is in the transmission state and the lower sensor is in the shielding state, the state does not change even if the strip-shaped workpiece W is being transported. Therefore, as was described above, a fault can be recognized and the device can be stopped. However, if depending on the state of the position of the strip-shaped workpiece W, the upper sensor 21 is randomly in the transmission state and the lower sensor 22 is in the shielding state, the position of the strip-shaped workpiece W changes as a result of the delivery of the strip-shaped workpiece W by the delivery reel 1 or as a result of the transport of the strip-shaped workpiece W to the exposure part 10 during triple transport and triple processing of the strip-shaped workpiece W. Thus, a change into the states as shown in FIGS. 3(d), 3(f) and 3(g) must inevitably occur. In this case, as was described above, "fault reservation" is reset and operation is continued proceeding from one of the states as shown in FIGS. 3(d), 3(f) and 3(g).

(iii) As shown in FIG. 3(f), the upper sensor 21 is in the shielding state. The sensor light of the lower sensor 22 passes through the passage area of the strip-shaped workpiece W, and the lower sensor 22 is shifted into the transmission state.

This is the same state as in FIG. 2(b). Rotation of the delivery reel 1 is continued. However, the position of the strip-shaped workpiece W is changed by the delivery of the strip-shaped workpiece W and is inevitably shifted into one of the states as shown in FIGS. 3(d), 3(e) and 3(g). When the state as shown in FIG. 3(d) is obtained, the rotation of the delivery reel 1 is stopped. When the state as shown in FIG. 3(e) is obtained, as was described above, the "fault reservation state" is obtained. When there is neither a barrier nor a fault of the sensor or the like, "fault reservation" is reset. Operation is continued according to the sensor states at this time.

(iv) As is shown in FIG. 3(g), the sensor light passes through the passage area of the strip-shaped workpiece W both for the upper sensor 21 and also for the lower sensor 22. Thus, the sensors 21, 22 are shifted into the transmission state.

This is the same state as shown in FIG. 2(c) or the state shown in FIG. 2(a). The delivery reel continues to turn. The position of the strip-shaped workpiece W is changed by the delivery of the strip-shaped workpiece W, as was described above, and is inevitably shifted into one of the states as shown in FIGS. 3(d), 3(e) and 3(f). When the state as shown in FIG. 3(d) is obtained, the rotation of the delivery reel 1 is stopped. When there is neither a barrier nor a fault or the like, the state proceeding from the state as shown in FIG. 3(e) or FIG. 3(f) is changed. When the state as shown in FIG. 3(d) is obtained, the rotation of the delivery reel 1 is stopped.

(4) If proceeding from the state as shown in FIG. 3(d) the strip-shaped workpiece W is transported, soon one of the states according to FIGS. 2(b), 2(c), FIGS. 3(e), 3(f), and 3(g) is obtained. In the case of the state as shown in FIG. 2(b), the previous state is continued. The delivery reel therefore remains stopped and is soon shifted into the state as shown in FIG. 2(a). In this way, the delivery reel 1 begins to turn. In the case of the state as shown in FIG. 2(c), the same state as the state which is shown in FIG. 2(a) is present. The delivery reel 1 therefore turns. In the cases as shown in FIG. 3(e) and FIG. 3(g), the situation proceeds in the above described manner. When the sensor state passes only into the state as shown in FIGS. 3(e), 3(f), or 3(g), it can be imagined that rotation of the delivery reel 1 does not stop and the strip-shaped workpiece W collects more and more in the dip A. In a transport test in practice using several types of strip-shaped workpieces with a different shape of the device holes, there was not, however, any case in which the strip-shaped workpiece W collected in the dip A.

B. Control of the Take-Up Reel

In this embodiment, the take-up reel control element 30(b) of the control element 30 controls the take-up reel 2 based on the outputs of the upper sensor 23 and the lower sensor 24 of the dip B in the manner shown in the following table.

TABLE 4

| Upper Sensor 23 | Transmission | Shielding | Shielding |
|---|---|---|---|
| Lower Sensor 24 | Transmission or Shielding | Transmission | Shielding |
| Take-up Reel Control | Stopping | Continuation of Operation | Rotation |

This means that, in the case in which the amount of sag of the strip-shaped workpiece W is small and both the upper sensor 23 and also the lower sensor 24 are in the transmission state, the take-up reel 2 is stopped. When the strip-shaped workpiece W is being transported, if the amount of sagging of the strip-shaped workpiece W in the dip B becomes large, and also when the upper sensor 23 is shifted into the shielding state, the stopped state of the take-up reel 2 is maintained. When both the upper sensor 21 and also the lower sensor 22 are shifted into the shielding state, the take-up reel 2 is turned and the strip-shaped workpiece W is taken up. This reduces the amount of sagging of the strip-shaped workpiece W. The rotary state of the take-up reel 2 is maintained even if the upper sensor 23 is shifted into the shielding state. When both the upper sensor 23 and also the lower sensor 24 are shifted again into the transmission state, the take-up reel 2 is stopped. In this way, control is exercised such that the lower end of the strip-shaped workpiece W is in the dip B between the upper sensor 23 and the lower sensor 24. During the above described operation, the sensor light is transmitted, for example, by the device holes which are through holes provided in the strip-shaped workpiece W. There are the following cases.

(1) Transmission state of the upper sensor 23 and transmission state of the lower sensor 24
(2) Shielding state of the upper sensor 23 and transmission state of the lower sensor 24
(3) Transmission state of the upper sensor 23 and shielding state of the lower sensor 24

In the above described case (1), the take-up reel 2 is stopped. In the above described case (2), the previous operating state is continued. If, for example, the take-up reel 2 turns, the rotary state is continued. When the take-up reel 2 stops, the stopped state is continued. In the above described case (3), the take-up reel 2 is stopped in this embodiment. In the state described above in (3), it is possible to imagine a case in which the sensor light is transmitted by the through openings which are located in the strip-shaped workpiece W and in which the upper sensor 23 in spite of the shielding state of the lower sensor 24 has been shifted into a transmission state, and a case in which, in the dip B, there is a barrier or that the lower sensor 24 has a fault. In any case, if the take-up reel 2 is controlled in the manner described in FIG. 4, no problem occurs.

If specifically the sensor light is transmitted by the through openings located in the strip-shaped workpiece W, and when the upper sensor 23 in spite of the shielding state of the lower sensor 24 has been shifted into the transmission state, the positions of the through openings are moved by the transport of the strip-shaped workpiece W until soon the upper sensor 23 is also shifted into the shielding state. When this state is reached, the take-up reel 2 begins to turn. Therefore, the problem does not arise that in the dip B the strip-shaped workpiece W collects more and more even if the take-up reel 2 is stopped in the state described above in (3).

In the state in which, in the dip B, there is a barrier or in which the state described above in (3) is obtained due to a fault of the lower sensor 24, by transport of the strip-shaped workpiece W during the stoppage of the take-up reel 2 the upper sensor 23 is soon shifted into the shielding state, by which the take-up reel 2 begins to turn. When the take-up reel 2 begins to turn, the upper sensor 23 is shifted into the transmission state and the lower sensor 24 into the shielding state and the take-up reel 2 stops turning. Then, the same processes are repeated and the amount of sagging of the strip-shaped workpiece W in the dip B is essentially constantly controlled.

The control of the take-up reel 2 by the above described take-up reel control element 30(b) is described below using FIGS. 4(a) to 4(c) and FIGS. 5(d) to 5(g). The transport direction or the like of the strip-shaped workpiece W is identical to the one in FIGS. 8(a) to 8(f).

Figure 4A:
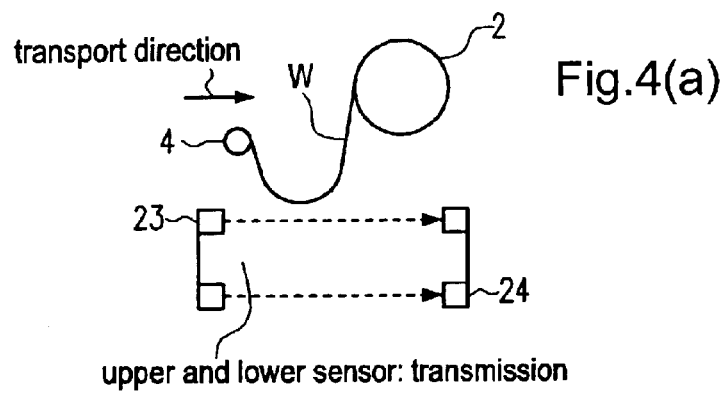
FIGS. 4(a) to 4(c) each show a schematic of a first control of a take-up reel.

(1) As shown in FIG. 4(a), the take-up reel 2 stops when the upper sensor 23 and the lower sensor 24 which are present in the dip B are shifted into the transmission state. The transport roller 6 turns and delivers the strip-shaped workpiece W after completion of exposure to dip B.

(2) The bottom end of the sagging strip-shaped workpiece W is located between the upper sensor 23 and the lower sensor 24. Here, the upper sensor 23 and the lower sensor 24 can be located in the following two states.

Figure 4B:
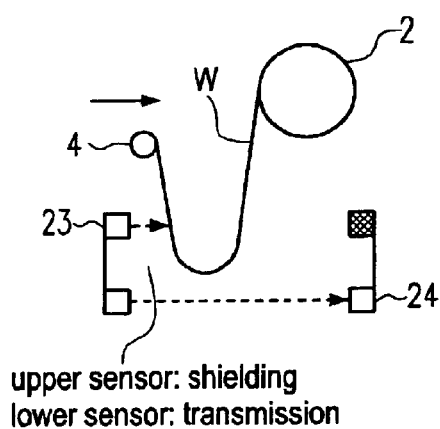

(i) As shown in FIG. 4(b), the strip-shaped workpiece W shields the upper sensor 23. This is the same state as in the conventional example. In the case of the shielding state of the upper sensor 23 and the transmission state of the lower sensor 24, the previous state is continued; this relates to operation of the take-up reel 2. In this case, the take-up reel 2 remains stopped.

Figure 4C:
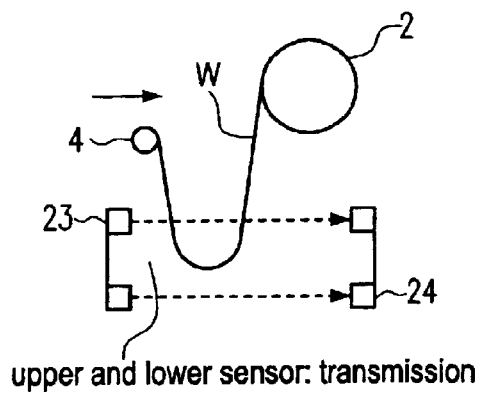

(ii) As shown in FIG. 4(c), the sensor light of the upper sensor 23 passes through the through openings of the strip-shaped workpiece W. This shifts the upper sensor 23 into the transmission state. This is the same state as the state shown above using FIG. 4(a). The take-up reel remains stopped.

(3) The delivery of the strip-shaped workpiece W to the dip B continues, by which the tip of the dip is located underneath the lower sensor 24. The upper sensor 23 and the lower sensor 24 can be in the following four states here.

Figure 5D:
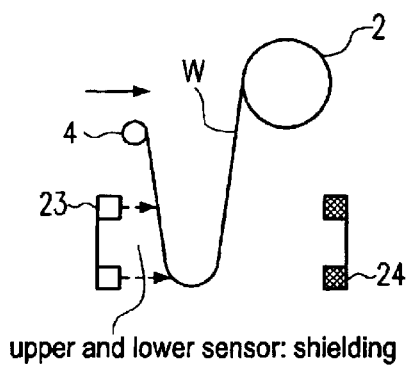
FIGS. 5(d) to 5(g) each show a schematic of a second control of a take-up reel.

(i) As shown in FIG. 5(d), the strip-shaped workpiece W shields the upper sensor 23 and the lower sensor 24. In this case, the take-up reel 2 starts to turn and to take up the strip-shaped workpiece W. This is the same state as in the conventional example.

Figure 5E:
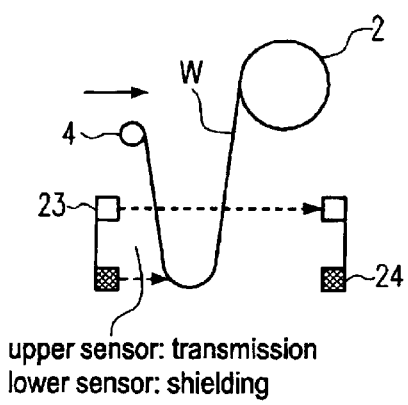

(ii) As shown in FIG. 5(e), the sensor light of the upper sensor 23 passes through the through openings of the strip-shaped workpiece W. The upper sensor 23 is shifted into the transmission state and the lower sensor 24 is shifted into the shielding state. Conventionally, this is immediately considered "faulty." However, in this embodiment, the rotation of the take-up reel is stopped. The take-up reel remains stopped until the strip-shaped workpiece W is exposed, transported, and shifted into the state as shown in FIG. 5(d).

Figure 5F:
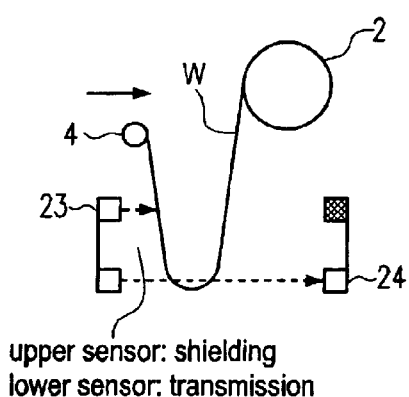

(iii) As shown in FIG. 5(f), the upper sensor 23 is in the shielding state. The sensor light of the lower sensor 24 passes through the through openings of the strip-shaped workpiece W, and the lower sensor 24 is in the transmission state. This is the same state as in FIG. 4(b). The take-up reel 2 remains stopped. The stoppage of the take-up reel 2 is maintained until the strip-shaped workpiece W is exposed, transported and shifted into the state as shown in FIG. 5(d).

Figure 5G:
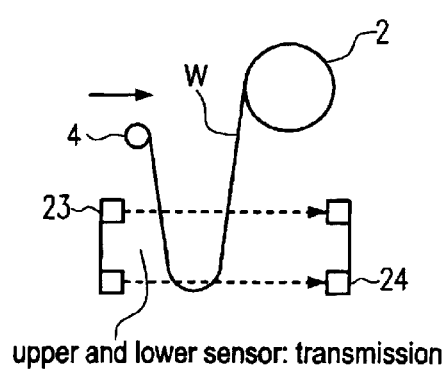

(iv) As shown in FIG. 5(g), the sensor light passes through the through openings of the strip-shaped workpiece W both for the upper sensor 23 and also the lower sensor 24. These sensors 23, 24 are in the transmission state. This is the same state as the state as shown in FIG. 4(c) or FIG. 4(a). The take-up reel 2 remains stopped. The stoppage of the take-up reel 2 is maintained until the strip-shaped workpiece W is exposed, transported and shifted into the state as shown in FIG. 5(d).

(4) If, proceeding from items (i) to (iv), the state as shown in FIG. 5(d) is reached, the take-up reel 2 turns and it begins to take up the strip-shaped workpiece W. In the case in which, by taking up the strip-shaped workpiece W, the states of the upper sensor 23 and the lower sensor 24 have passed into the state as shown in FIG. 4(b) or FIG. 5(f), the previous state is continued; this relates to operation of the take-up reel. The take-up reel therefore continues to turn and takes up the strip-shaped workpiece W. When the strip-shaped workpiece W has been taken up, and when the state as shown in FIG. 4(a) is reached, the take-up reel 2 stops turning.

Furthermore, if, proceeding from FIG. 5(d) a transition into one of the states as shown in FIG. 4(c), FIG. 5(e) and FIG. 5(g) has taken place, the take-up reel 2 stops. The take-up reel 2 continues to be stopped as was described above until the state as shown in FIG. 5(d) has been reached.

When the states of the upper sensor 23 and the lower sensor 24 pass only into the state as shown in FIG. 5(e), 5(f) or 5(g), as on the side of the delivery reel, it can be imagined that the take-up reel 2 is not turning and that the strip-shaped workpiece W is collecting more and more in the dip B. However, in a transport test in practice using several types of strip-shaped workpieces with a different shape of the device holes, there was not any case in which the strip-shaped workpiece W collected in the dip B.

Action of the Invention

As was described above, the following effects can be obtained in accordance with the invention:

(1) Even if the strip-shaped workpiece has partial through openings, such as device holes or the like, through which sensor light passes, the transport of the strip-shaped workpiece, its delivery by a reel and its take-up onto a reel can be continued.

(2) In the case in which the sensor which is located downstream of the dip on the side of the delivery reel, due to a barrier or the like, is shifted into a shielding state or a fault or the like occurs in this sensor, occurrence of a fault can be recognized and operation of the device can be stopped. Furthermore, in the case in which the sensor which is located downstream of the dip on the side of the take-up reel due to a barrier or the like is shifted into a shielding state, or that a fault or the like occurs in this sensor, the strip-shaped workpiece can be taken up without stopping operation of the device.

What we claim is:

1. Device for processing of a strip-shaped workpiece, comprising:

a delivery reel for supplying a strip-shaped workpiece wound thereon;

a processing unit located downstream the delivery reel at which a treatment is performed on a portion of said strip-shaped workpiece;

a take-up reel located downstream of the processing unit for taking up the strip-shaped workpiece after processing thereof in the processing unit;

a transport mechanism for transporting the strip-shaped workpiece from the delivery reel to the processing part;

wherein:

an upper sensor and a lower sensor which are located one above the other at locations below a direct path between delivery reel and the processing part, said sensors being adapted to determine the presence and absence of the strip-shaped workpiece sagging between the delivery reel and the processing part;

a drive device for driving the delivery reel; and a control element which controls processing and transporting of the strip-shaped workpiece with a preset frequency that corresponds to a preset number of transport and treatment cycles performed by said transport mechanism and processing unit, and which, upon occurrence of a state in which the upper sensor has determined the absence of the workpiece and the lower sensor has determined the presence of the workpiece, detects a fault and interrupts processing and transport if said state remains throughout a delay interval spanning a multiple of said preset frequency.

2. Device for processing of a strip-shaped workpiece as claimed in claim 1, further comprising:

a second upper senior and a second lower sensor which are located one above the other at locations below a direct path between the processing part and the take-up reel, said second sensors being adapted to determine the presence and absence of the strip-shaped workpiece sagging between the processing part and the take-up reel;

a take-up reel drive device for driving the take-up reel; and wherein said control element is adapted to start operation of the take-up reel drive device only when both the upper sensor and the lower sensor have determined the presence of the workpiece and stops operation of the take-up reel when the upper sensor has determined the absence of a workpiece.

* * * * *